(12) United States Patent
Guo

(10) Patent No.: US 7,638,022 B2
(45) Date of Patent: Dec. 29, 2009

(54) MAGNETRON SOURCE FOR DEPOSITION ON LARGE SUBSTRATES

(75) Inventor: George Xinsheng Guo, Palo Alto, CA (US)

(73) Assignee: Ascentool, Inc, Cupertino, CA (US)

( * ) Notice: Subject to any disclaimer, the term of this patent is extended or adjusted under 35 U.S.C. 154(b) by 599 days.

(21) Appl. No.: 11/363,024

(22) Filed: Feb. 27, 2006

(65) Prior Publication Data

US 2007/0199817 A1   Aug. 30, 2007

(51) Int. Cl.
*C23C 14/06* (2006.01)

(52) U.S. Cl. .................. 204/298.16; 204/298.26; 204/298.15; 204/298.12

(58) Field of Classification Search .......... None
See application file for complete search history.

(56) References Cited

U.S. PATENT DOCUMENTS

| | | | | |
|---|---|---|---|---|
| 4,468,313 | A | * | 8/1984 | Okumura et al. ........ 204/298.12 |
| 4,939,043 | A | | 7/1990 | Birocik |
| 5,296,979 | A | | 3/1994 | Kawabe |
| 5,317,006 | A | * | 5/1994 | Kumar .................. 204/298.12 |
| 5,333,726 | A | | 8/1994 | Makowiecki |
| 5,374,343 | A | | 12/1994 | Sasaki |
| 5,747,119 | A | | 5/1998 | Hirata |
| 5,755,938 | A | | 5/1998 | Fukui |
| 5,798,029 | A | * | 8/1998 | Morita ................... 204/298.16 |
| 5,953,827 | A | | 9/1999 | Or |
| 5,985,115 | A | | 11/1999 | Hartsough |
| 6,080,287 | A | | 6/2000 | Drewery |
| 6,099,706 | A | | 8/2000 | Hirabayashi |
| 6,113,752 | A | | 9/2000 | Hollstein |
| 6,207,026 | B1 | | 3/2001 | Crocker |
| 6,217,714 | B1 | * | 4/2001 | Nishihara et al. ....... 204/192.12 |
| 6,221,217 | B1 | | 4/2001 | Moslehi |
| 6,235,634 | B1 | | 5/2001 | White |
| 6,238,532 | B1 | | 5/2001 | Rossnagel |
| 6,328,857 | B1 | * | 12/2001 | Anzaki et al. .......... 204/192.12 |
| 6,337,001 | B1 | * | 1/2002 | Haag et al. .............. 204/192.2 |
| 6,337,003 | B1 | | 1/2002 | Kinokiri |
| 6,413,380 | B1 | | 7/2002 | Pinarbasi |
| 6,444,100 | B1 | * | 9/2002 | McLeod ................ 204/192.16 |
| 6,454,920 | B1 | | 9/2002 | Haag |
| 6,641,701 | B1 | | 11/2003 | Tepman |
| 6,692,618 | B2 | | 2/2004 | Dubs |
| 6,730,194 | B2 | | 5/2004 | Schertler |
| 6,730,196 | B2 | * | 5/2004 | Wang et al. ............ 204/298.06 |
| 6,740,585 | B2 | | 5/2004 | Yoon |
| 6,758,948 | B2 | | 7/2004 | Johnson |
| 2004/0129556 | A1 | | 7/2004 | Bernick |

* cited by examiner

*Primary Examiner*—Nam X Nguyen
*Assistant Examiner*—Jason M Berman
(74) *Attorney, Agent, or Firm*—Xin Wen

(57) ABSTRACT

A magnetron source for producing a magnetic field near a surface of a target in a deposition system include a first magnet, a second magnet separated by a gap from the first magnet along a first direction, and a target holder configured to hold the target in the gap between the first magnet and the second magnet. The target includes a sputtering surface from which target material can be sputtered and deposited on a substrate. The target holder is so configured that the sputtering surface is substantially parallel to the first direction and the first magnet and the second magnet can produce a magnetic field near a surface of the target.

23 Claims, 13 Drawing Sheets

MAGNETRON SOURCE FOR DEPOSITION ON LARGE SUBSTRATES

TECHNICAL FIELD

This application relates to apparatus for depositing material on a substrate.

BACKGROUND

Material deposition on large substrates or multiple substrates held by a large holder is widely used in window glass coating, flat panel display manufacturing, coating of flexible films, hard disk coating, industrial surface coating, semiconductor wafer processing, and other applications. In such a deposition system, the magnetron source, the target, and the substrate can be transported relative to each other. At least one dimension of a target needs to be larger than a dimension of the substrate such that the substrate can be fully covered by the material sputtered off the target.

Different designs exist in the conventional deposition systems for large substrates. But the designs all have different drawbacks. In the first example, as shown in FIGS. 1A-1D, a deposition system 100 includes a long narrow rectangular target 110 over a large substrate 115 in a vacuum chamber 120. A magnetron 130 is held behind the target 110. The substrate 115 can be transported in the direction 150 relative to the target 110 and the magnetron 130 to receive a uniform deposition across the top surface of the substrate 115. The magnetron 130 is stationary relative to the target 110. The deposition system 100 can also includes a power supply 140 that can produce an electric bias between the target and walls of the vacuum chamber 120.

The magnetron 130 includes a magnetic pole 132 of a first polarity and a magnetic pole 135 of an opposite polarity to the first. The magnetron 120 can produce magnetic flux outside of the sputtering surface 112 on the lower side of the target 110 as shown in FIG. 1B. A close loop magnetic field track can be formed outside of the sputtering surface 112 for trapping the electrons and thus enhancing the plasma near the sputtering surface 112. More electrons are trapped near the maximum magnetic field produced by the magnetron 130 parallel to the sputtering surface 112. The locations having the maximum magnetic field strength form a close loop that can guide the migration path for the free electrons. The closed-loop magnetic field enhances the ionization efficiency of the sputtering gas and lowers the operating pressure during sputter deposition. The enhanced sputtering due to magnetic field can produce an erosion pattern over the sputtering surface 112 after repeated sputtering operations, as shown in FIG. 1D.

The drawback of the deposition system 100 is that the magnetron 130 is stationary relative to the target 110 during the depositions, which produces non-uniform erosion on the sputtering surface 112 of the target 110. The non-uniform erosion can result in low target utilization and re-deposition of sputtered target materials on the areas of the sputtering surface 112 having low magnetic field strength. Some of the accumulated materials can fall off the target 110 and land undesirable particle deposition on the substrate 115.

Another conventional deposition system 200 is shown in FIGS. 2A and 2B. The deposition system 200 includes a large target 210, a vacuum chamber 220, and a magnetron 230 on the back side (opposite to the sputtering surface 212) of the large target 210. The magnetron 230 can scan across along the direction 250. The substrate 215 is held over a substrate holder 217. The substrate 215 remains stationary during the deposition for target with dimensions larger than the substrate, and can have a relative movement to the target 210 for smaller target.

Although the scanning of the magnetron 230 relative to target 210 can improve the target utilization and prevent target material re-deposition, the deposition system 200 has the disadvantages of using a large and thus expensive target. In addition, the areas of the target 210 at the ends of the scanning direction can only be reached by a single track of the magnetron 230, while the middle section of the target 210 is scanned by both tracks of the magnetron. This limitation lowers the sputter rate near the edges of the target 210 resulting in non-uniform deposition over the substrate 115.

Yet another conventional deposition system 300 is shown in FIG. 3. The deposition system 300 includes a circular target 310, a stationary magnetron 330, a substrate 315 that can be transported along one direction, and a vacuum chamber 320. The circular target 310 can rotate around the magnetron 330 by a rotational mechanism to expose different areas of the circular target 310 the magnetic fields of the magnetron 310 so that the target materials can be sputtered at the sputtering surface 312. The erosion pattern can be more uniform due the circular movement of the target 310. The high cost of the single-piece circular target 312 is a significant disadvantage in the deposition system 300. Moreover, target material is often is sprayed on the backing plate 313, which reduces the quality of the deposition material. The vacuum seal of the rotational transport mechanism is also an engineering challenge. System reliability can be reduced due to unreliable vacuum sealing at the rotational transport mechanism.

Another disadvantage of the conventional deposition systems is that they are not suitable for thick target, especially the ones comprising magnetic or ferromagnetic materials. The magnetic fields produced by the magnetrons cannot penetrate the thick target. The limitation in the target thickness reduces the amount of materials that can be deposited for each target change-over.

Yet another disadvantage of the conventional deposition systems is that the target width has to be large enough to accommodate at least one magnetic field loop. In practice, the target width is typically more than 3 inches wide. This will increase target cost and increase system size.

Yet another disadvantage of the conventional deposition systems is that the deposition is made only on one side of the substrate. A double-sided conventional deposition system 400 requires two opposing magnetrons 430a and 430b and two associated targets 410a and 410b in a vacuum chamber 420 as shown in FIG. 4. There can be two separate substrates 415a and 415b, or two deposition surfaces of a single substrate.

SUMMARY

Implementations of the system may include one or more of the following. In one aspect, the present invention relates to a magnetron source for producing a magnetic field near a surface of a target in a deposition system, comprising:

a first magnet;

a second magnet separated by a gap from the first magnet along a first direction; and a target holder configured to hold the target in the gap between the first magnet and the second magnet, wherein the target comprises a sputtering surface from which target material can be sputtered and deposited on a substrate, and wherein the target holder is so configured that the sputtering surface is substantially parallel to the first direction and the first magnet and the second magnet can produce a magnetic field near a surface of the target.

In another aspect, the present invention relates to a magnetron source for producing a magnetic field near a surface of a target in a deposition system, comprising:
 a first magnet that forms a first close loop;
 a second magnet that forms a second close loop, wherein the second magnet is separated by a gap from the first magnet along a first direction, and wherein the first magnet and the second magnet comprise opposite magnetic polarities; and
 a target holder configured to hold one or more targets in the gap between the first magnet and the second magnet, wherein each of the targets comprises a sputtering surface from which target material can be sputtered and deposited on a substrate, and wherein the target holder is so configured that the sputtering surface is substantially parallel to the first direction and the first magnet and the second magnet can produce a magnetic field near a surface of the one or more targets.

In another aspect, the present invention relates to a deposition system, comprising:
 a magnetron source, comprising:
 a first magnet; and
 a second magnet separated by a gap from the first magnet along a first direction;
 a target holder configured to hold a target in the gap between the first magnet and the second magnet, wherein the target comprises a sputtering surface from which target material can be sputtered and deposited on a substrate, and wherein the target holder is so configured that the sputtering surface is substantially parallel to the first direction and the first magnet and the second magnet can produce a magnetic field near the sputtering surface of the target; and
 a substrate holder configured to hold a substrate that is adapted to receive materials sputtered of the sputtering surface of target.

In another aspect, the present invention relates to a deposition system, comprising:
 a plurality of magnetron sources, each comprising:
 a first magnet; and
 a second magnet separated by a gap from the first magnet along a first direction;
 one or more target holder configured to hold the target in the gap between the first magnet and the second magnet of each of the magnetron source, wherein the target comprises a sputtering surface from which target material can be sputtered and deposited on a substrate, and wherein the target holder is so configured that the sputtering surface is substantially parallel to the first direction and the first magnet and the second magnet in the magnetron source can produce a magnetic field near the sputtering surface of the target; and
 a transport mechanism configured to move the substrate relative to one or more target holders to allow different areas of the substrate to receive materials sputtered of the sputtering surfaces of the targets.

Embodiments may include one or more of the following advantages. The disclosed deposition system can provide uniform depositions over a large substrate. The disclosed magnetron source can improve target utilization and reduce target cost by reducing the uneven erosion pattern in the target.

The disclosed deposition system can improve magnetic field uniformity on sputtering surface of the target surface and produce high and controllable deposition rate across substrate. Moreover, the disclosed deposition system can significantly reduce the contamination resulted from re-deposition of target materials in the conventional deposition systems.

The disclosed deposition system can generate high sputtering rate for magnetic and ferromagnetic target materials. Furthermore, the disclosed system can utilize thick target materials.

The disclosed magnetron source can reduce the footprint of the deposition system. The deposition system is suitable for double-sided depositions.

The details of one or more embodiments are set forth in the accompanying drawings and in the description below. Other features, objects, and advantages of the invention will become apparent from the description and drawings, and from the claims.

DETAILED DESCRIPTION

Figure 1A:
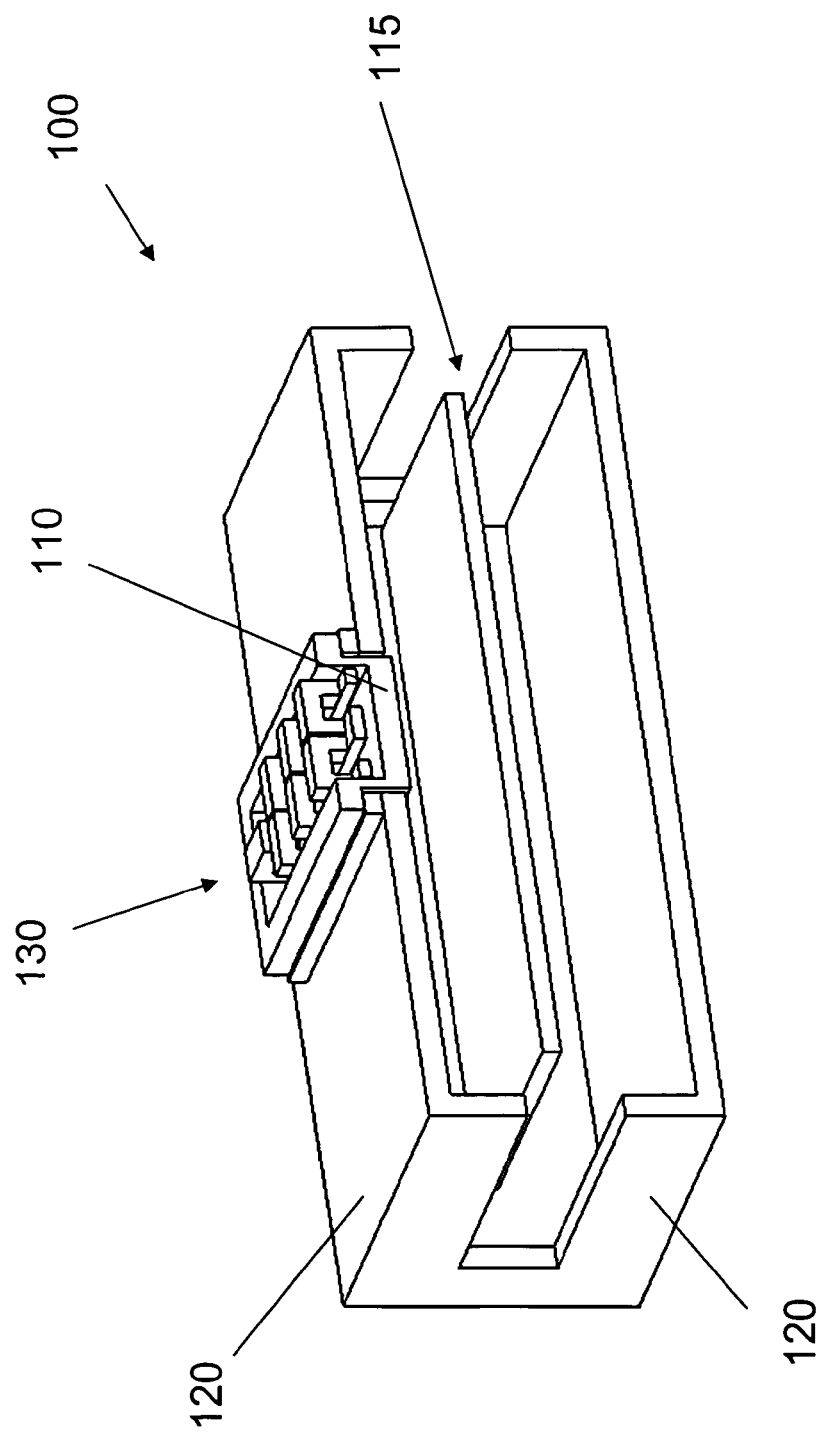
FIG. 1A illustrates a cross section of a conventional deposition system.
Figure 1B:
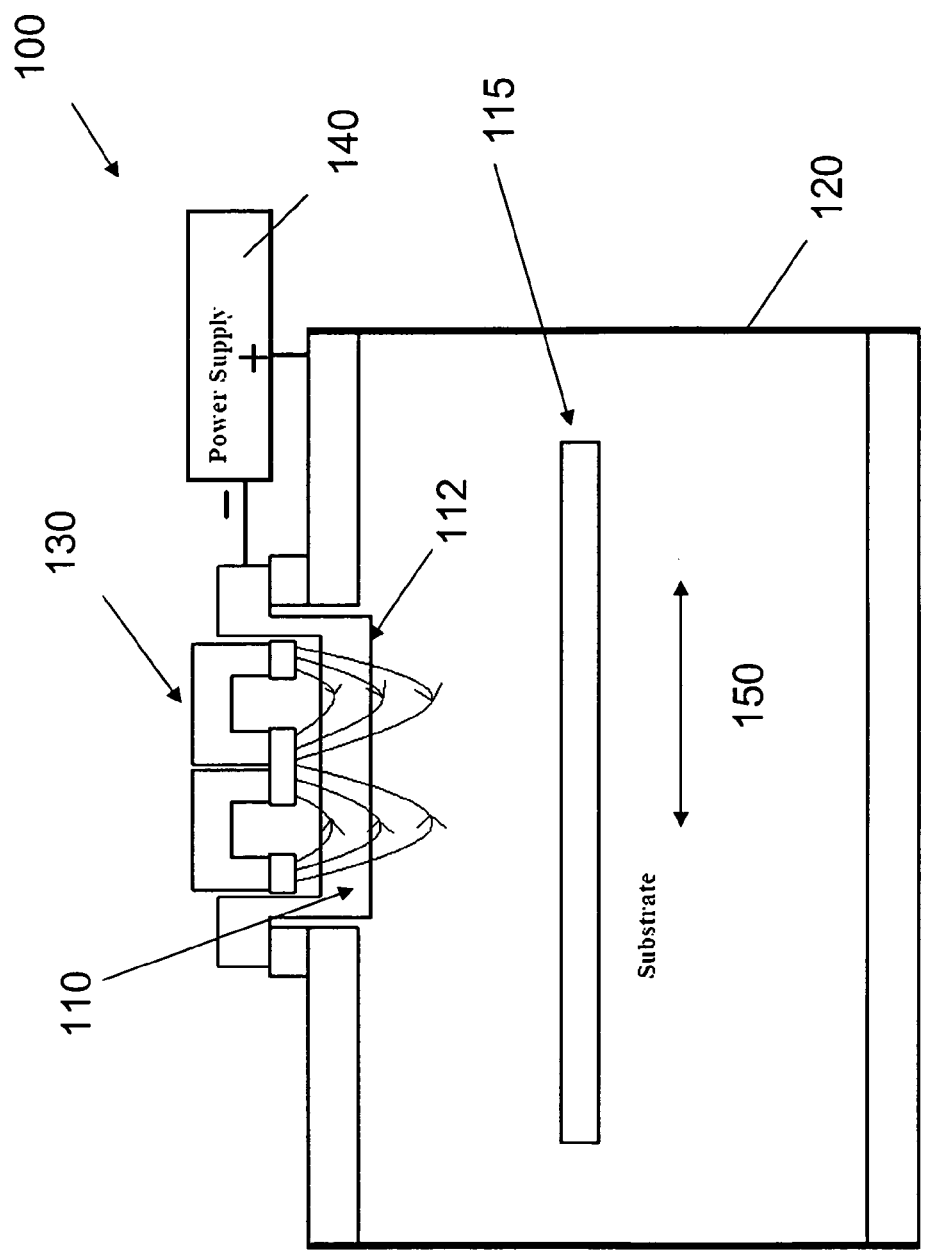
FIG. 1B is a cross sectional view of the conventional deposition system of FIG. 1A.
Figure 1C:
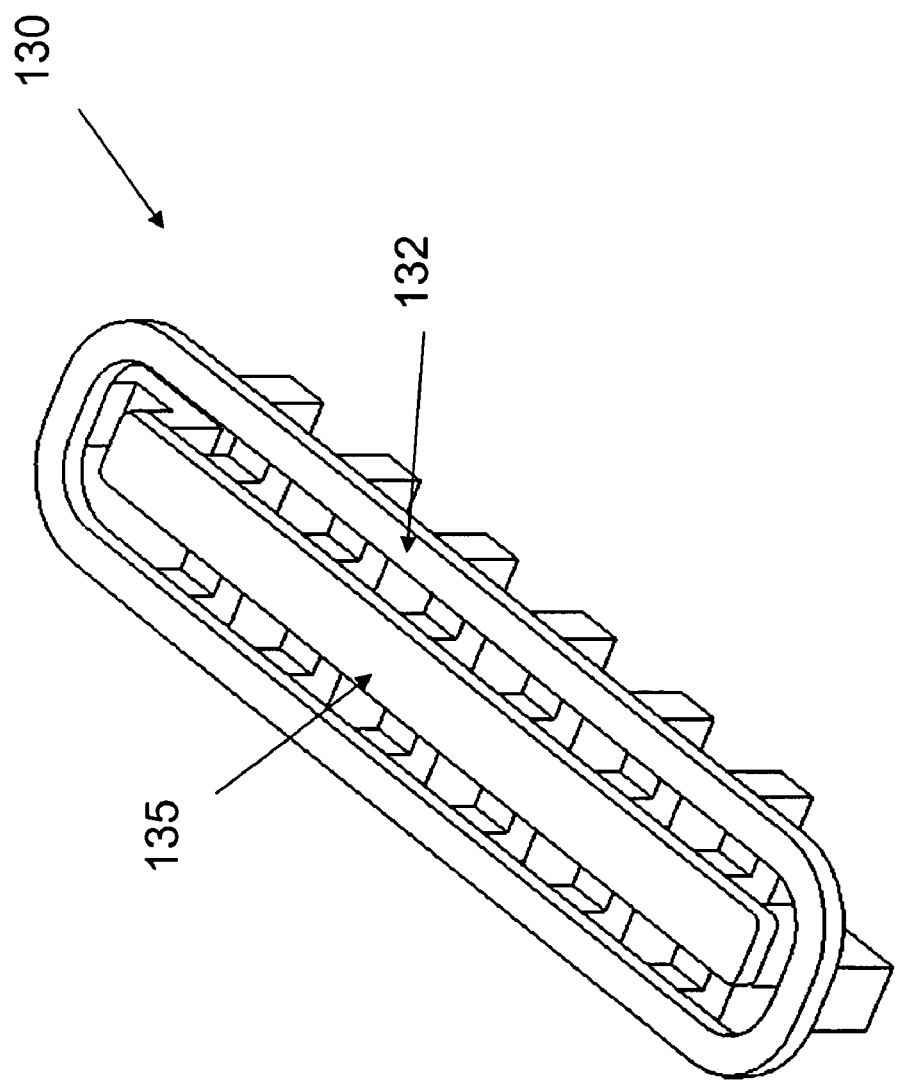
FIG. 1C is a bottom perspective view of the magnetron source in the conventional deposition system of FIG. 1A.
Figure 1D:
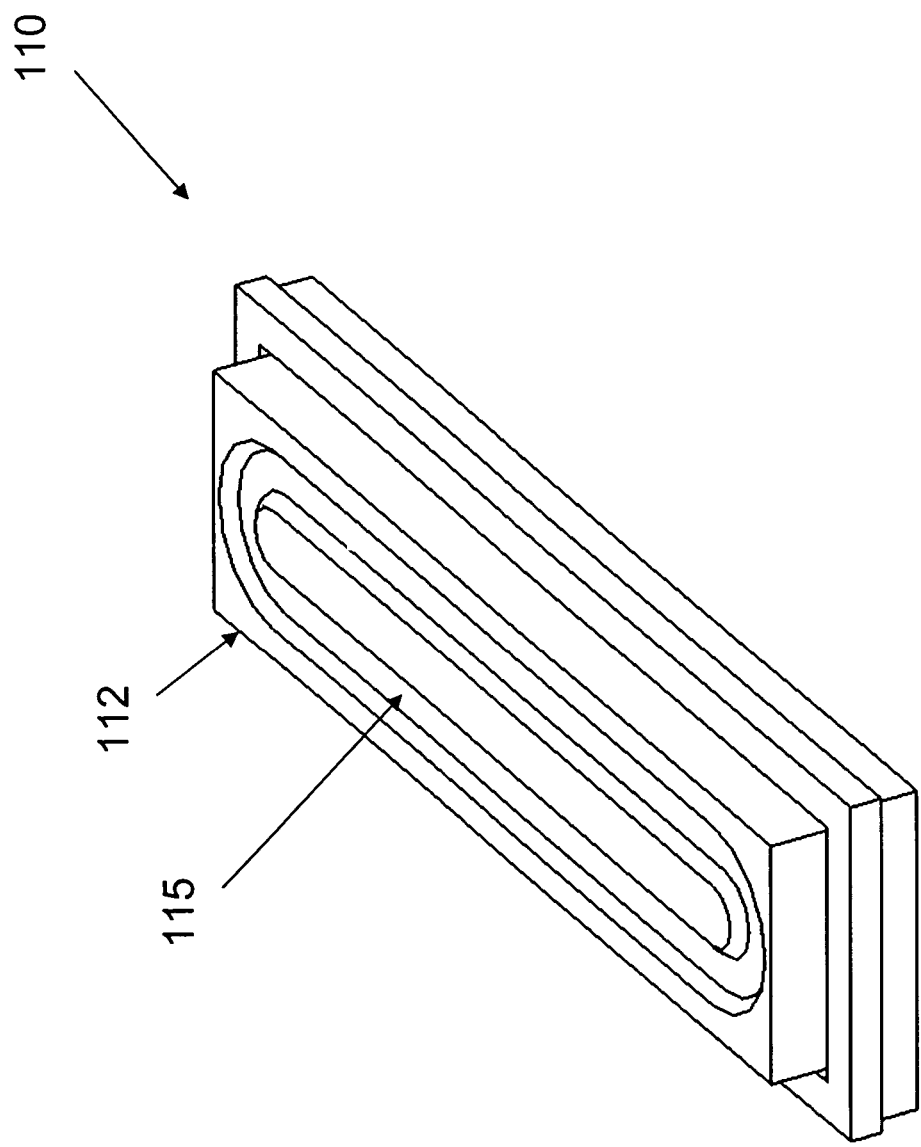
FIG. 1D is a bottom perspective view of the target and the erosion pattern on the target in the conventional deposition system of FIG. 1A.
Figure 2A:
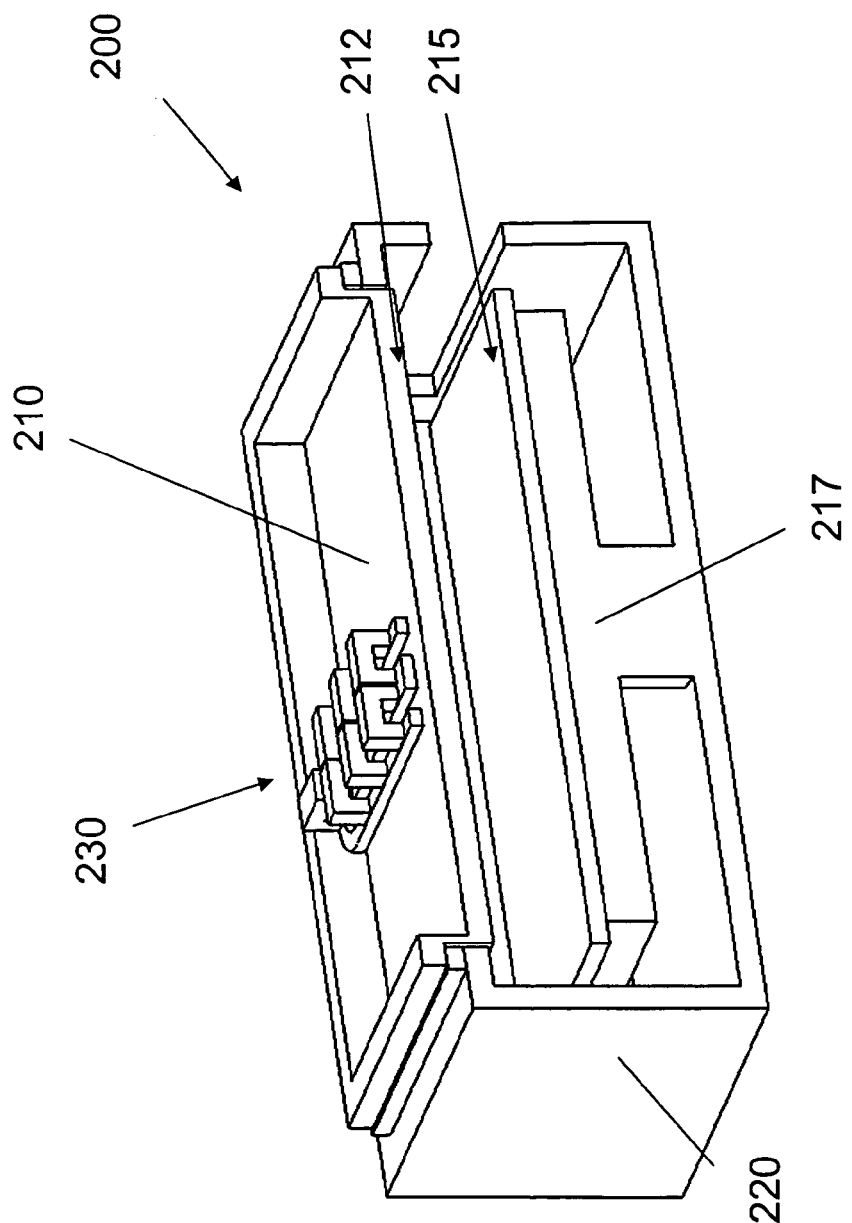
FIG. 2A illustrates a cross section of another conventional deposition system.
Figure 2B:
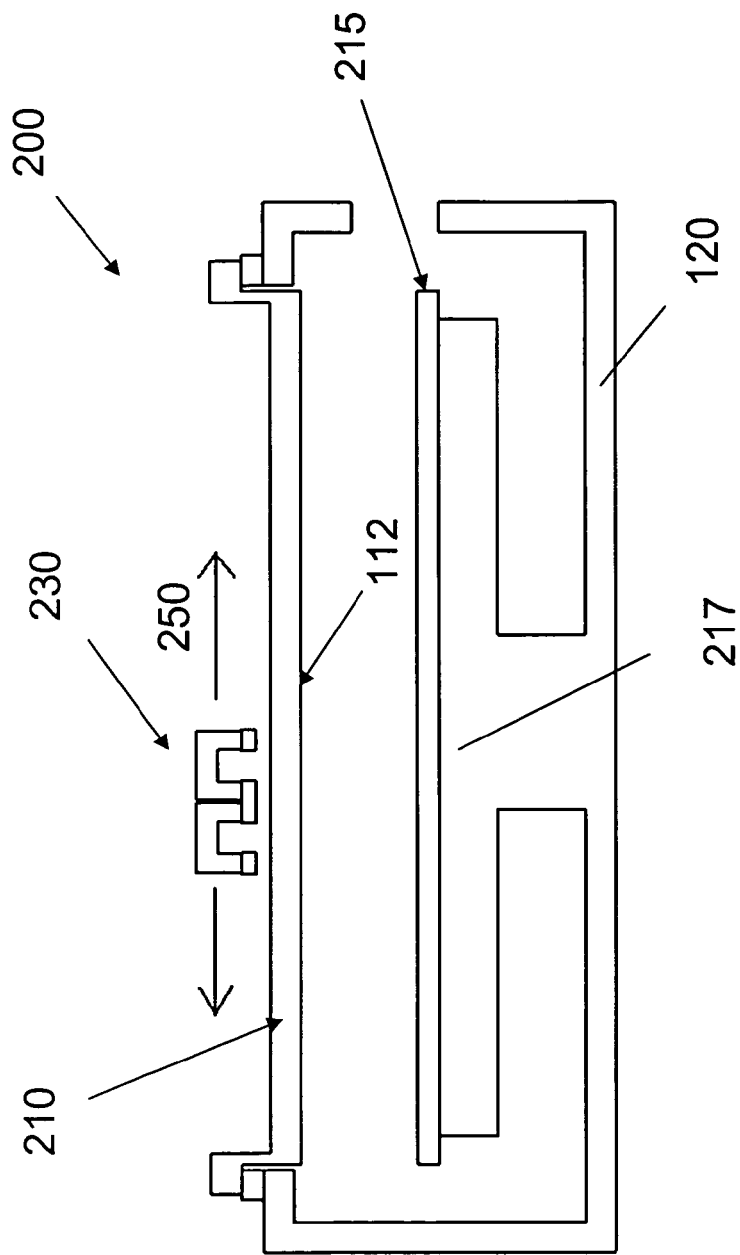
FIG. 2B is a cross sectional view of the conventional deposition system of FIG. 2A.
Figure 3:
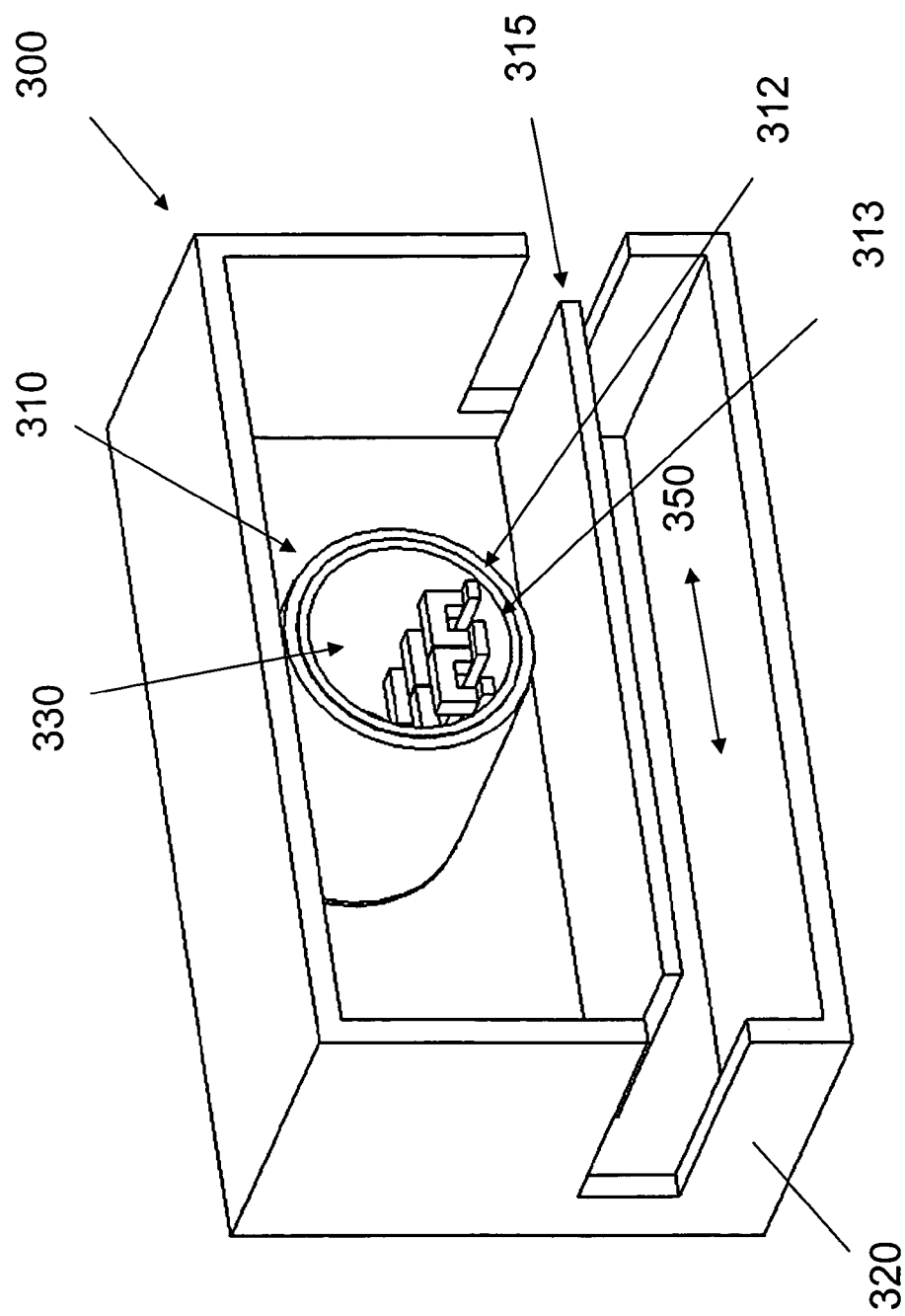
FIG. 3 illustrates a perspective view of yet another conventional deposition system.
Figure 4:
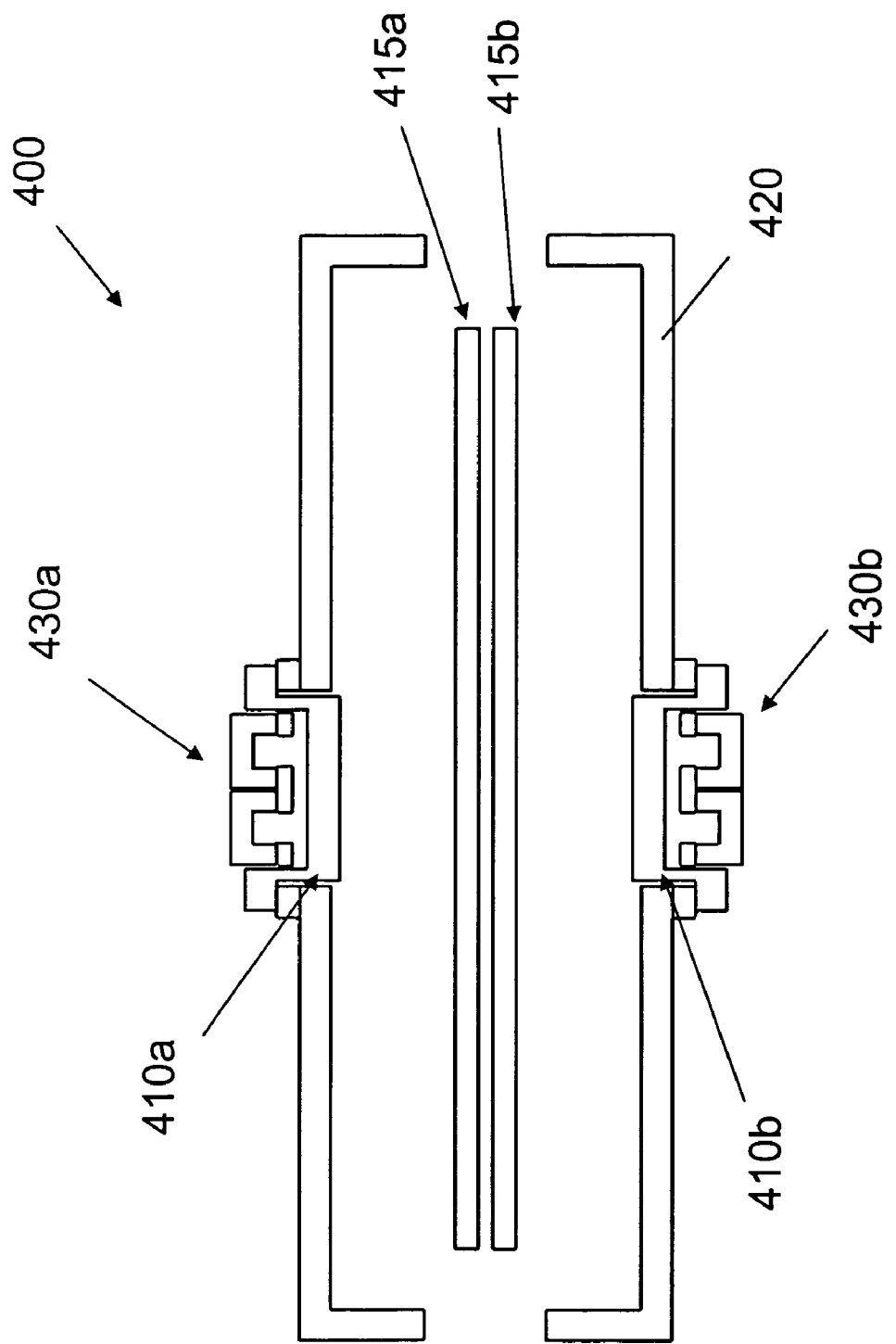
FIG. 4 is a cross-sectional view of a conventional deposition system for double sided deposition.
Figure 5A:
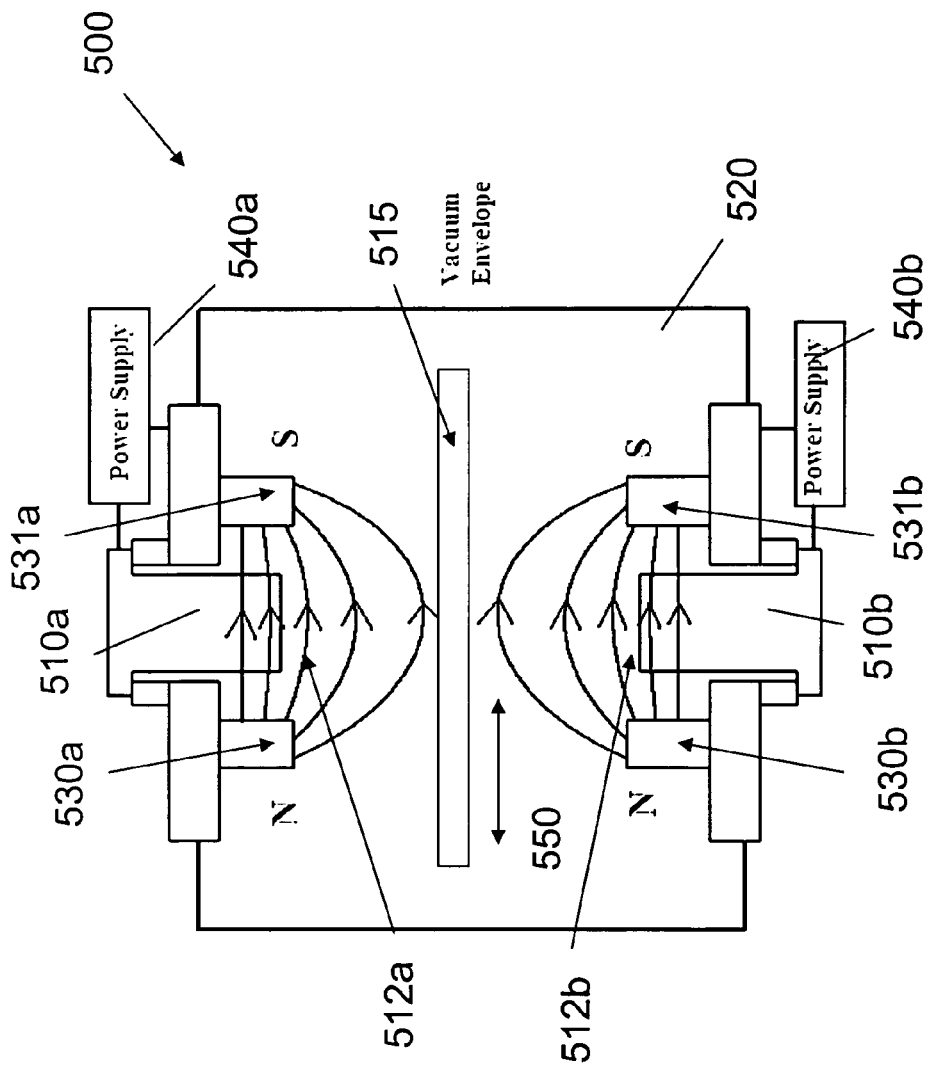
FIG. 5A illustrates a deposition system in accordance with the present invention.
Figure 5B:
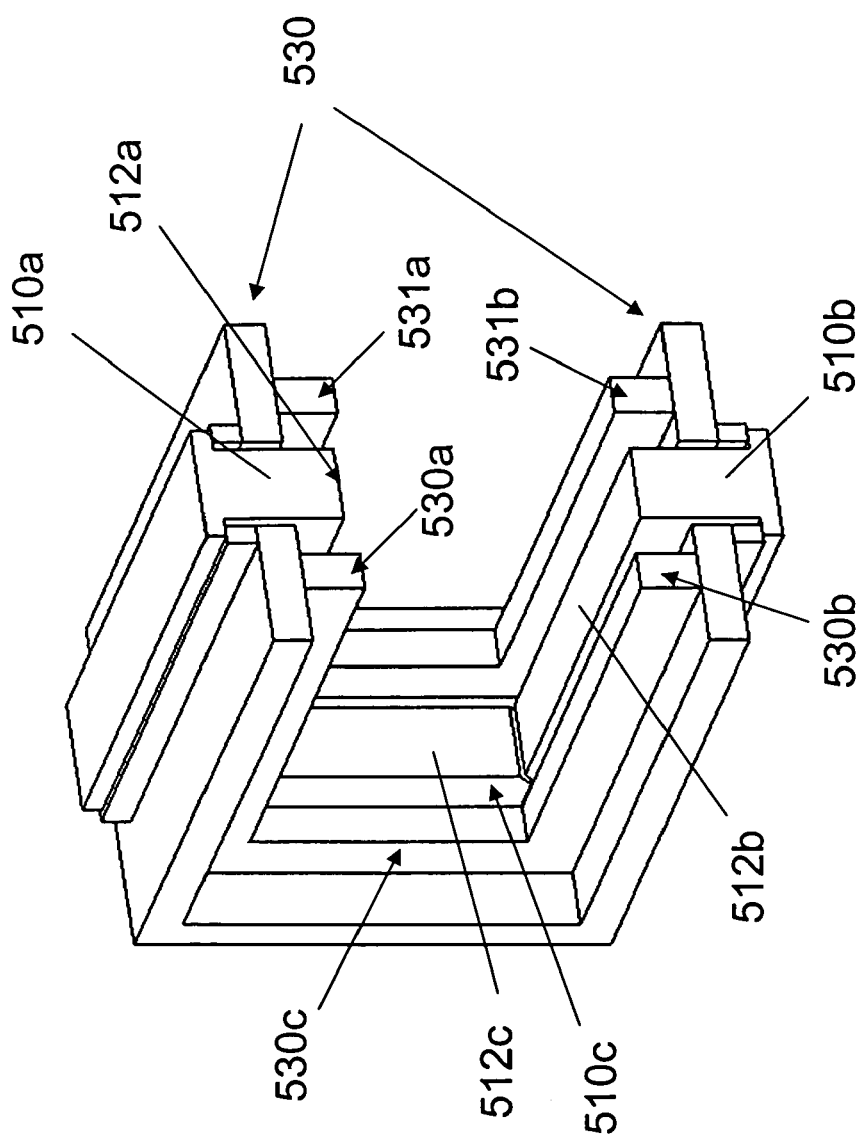
FIG. 5B illustrates a magnetron source and the associated target in the deposition system of FIG. 5A.

A deposition system 500 in accordance with the present invention is shown in FIG. 5A. A magnetron source and a target 530 and one or more targets 510a-510c are shown in FIG. 5B. The deposition system 500 includes one or more targets 510a, 510b, 510c, 510d, a magnetron source 530, a substrate 515 that can be transported along the direction 550, and a vacuum chamber 520. The magnetron source 530 can comprise a pair of magnets 530a and 531a above the substrate 515. The magnet 530a can be of a "North" polarity and the magnet 531a of "South" polarity, which produces magnetic flux lines from the magnet 530a to magnet 531a as shown in FIG. 5A. Similarly, a pair of magnets 530b and 531b is positioned under the substrate 515. Both pairs of magnets 530a/531a and 530b/531b can produce magnetic field lines having components substantially parallel to the sputtering surfaces 512a and 512b. The magnetron source 530 also includes two vertical pairs of magnets 530c/531c and 530d/531d (not shown for clarity reasons) of opposing polarities in each pair. The magnets 530a, 530b, 530c, and 530d of the "North" polarity can form a close loop. Similarly the magnets of the "South" polarity in the magnets 531a, 531b, 531c, and 531d can also form a close loop. Each pair of the magnets 530a/531a, 530b/531b, 530c/531c, or 530d/531d can also be connected on the outer rim by ferromagnetic material, which can enhance the magnetic field strengths near the sputtering surfaces 512a-d.

The magnets 530a-d and magnets 531a-d can comprise permanent magnets such as rare earth magnets, or ceramic magnet. They can be connected using a ferromagnetic material such as a 400 series stainless steel and a Mu-metal. In the present specification, as described below, the magnets 530a-d can also include electric conductor coils or electromagnets that can generate magnetic flux similar to the permanent magnetic materials.

The targets 510a-510c and target 510d (not shown in FIG. 5B for clarity reasons) are sandwiched between the two closed looped magnets of opposing polarities. The cross section of the target 510a-510d can also take other shapes such as curved surface, non-orthogonal sidewalls, and non-flat sputtering surfaces. The vacuum chamber 520 is at ground potential or is positively biased. The substrate 515 can be at ground potential of independently biased. The magnets 530a-530d can be held at ground potential or positively biased as part of the anode. The targets 510a-510d are insulated from the vacuum chamber 520 and negatively biased during the deposition forming a continuous electrical field around the loop. The targets 510a-510d can be separated from each other each independently biased, or biased by the same power supply. The sputtering rate from each of the four targets can therefore be individually varied. The targets 510a-510d can also be connected or formed by a single target piece of material, which is biased a single power supply. The negatively biased targets 510a-510d attract and accelerate positive ions to sputter materials off the sputtering surface 512a-512d of the targets 510a-510d which can be subsequently deposited on the substrate 515.

The typical dimension for large substrate is 1 to 2 meters on one side. For example, an 8th generation flat panel substrate is approximately 2.2×2.4 meters. The lengths of the long targets 510a and 510b are typically at least 0.1 meters longer than the smaller dimension of the substrate. The lengths of the short targets 510c and 510d are typically at least 0.1 meter longer than the thickness of the substrate and substrate holder.

The electric biases can be provided by power supplies 540a and 540b. The power supplies 540a and 540b can also provide Alternative Current (AC) or Radio Frequency (RF) in addition to DC power supply.

The substrate 515 is transported horizontally through the close loops formed by the magnets 530a-530d and the targets 510a-510d such that the top and bottom surfaces of the substrate 515 can be respectively exposed to the sputtering surfaces 512a and 512b.

An advantageous feature of the deposition system 500 is that the targets 510a-510d are held between the oppositely poled pairs of magnets 530a-530d. The North and South poled magnets are displaced along the horizontal direction. The sputtering surfaces 521a and 512b are substantially parallel to the horizontal direction. The magnetic field flux as shown in FIG. 5A thus has a large component parallel to the sputtering surfaces 512a and 512b. The large tangential component of the magnetic fields can apply strong Lorentz forces to bend the paths of the electrons that are repelled at high velocity by the negative bias of the sputtering surfaces 512a-512d. The electrons can be curved back to the target 530a-530d before they again bounce away from the targets. This bouncing-pulling cycle can repeat many times until the electrons lose the kinetic energy and the Lorentz force becomes insignificant.

The sputtering off target 512a and 512b depends on uniformity of the magnetic field strength on the surface. It is relative easy to have consistent magnetic field by using the same type of permanent magnets or electric conductor coil. The sputtering off the targets 512c and 512d can deposit materials along the edges of the substrate 515 or used to fine tune to the deposition uniformity over the upper and lower surfaces of the substrate 515.

The trapping of the fast moving electrons at the sputtering surfaces can enhances the plasma ionization efficiency. The closed loop arrangement of the targets can ensure the fast-moving electrons to be contained in the close loop. Since most electrons are trapped near the sputtering surfaces 512a-512d, most of the sputtering occurs at the surfaces sputtering surfaces 512a-d, that is, the target surfaces that are facing the substrate 515. Since the magnetic field is perpendicular to the side surfaces of the targets 510a-510d, the electrons cannot be effectively trapped near those surfaces. The plasma density and the sputtering erosion are low on the target sidewalls.

By arranging the "North" and the "South" poled magnets, a substantially uniform magnetic field can be formed in the tangential directions relative to the sputtering surfaces 512a-d. The uniform magnetic field can ensure full target surface erosion and even erosion across target surface, which in turn produces a high target material utilization.

In another embodiment, the substrate 515 can be replaced by a two substrates for single sided deposition. The upper substrate receives deposition material on its upper surface. The lower substrate receives deposition material on its lower surface. This configuration thus allows parallel depositions on two substrate pieces which doubles the throughput comparing to a single-substrate processing.

Figure 6:
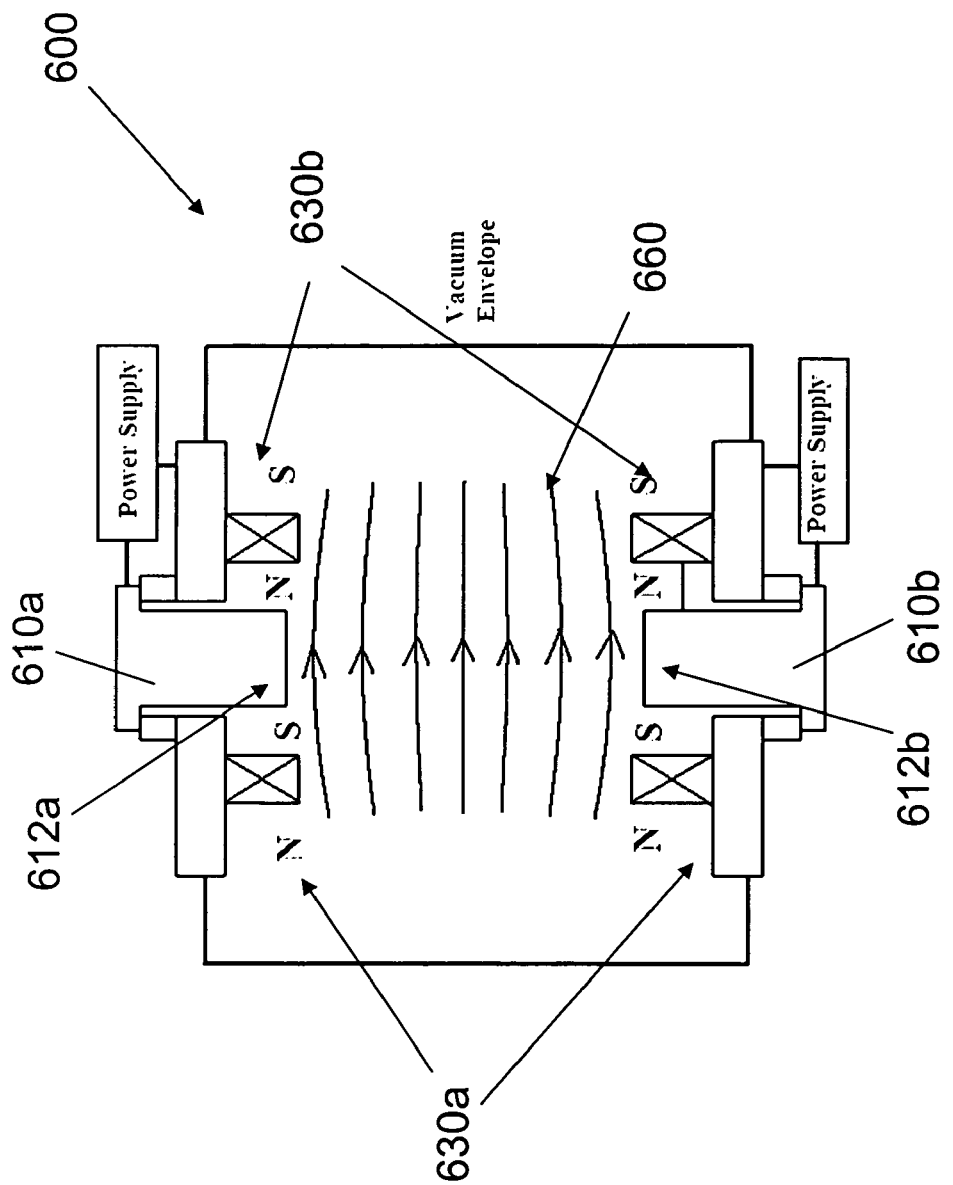
FIG. 6 illustrates a deposition system having a magnetron source including one or more electric conductor coils.
Figure 7:
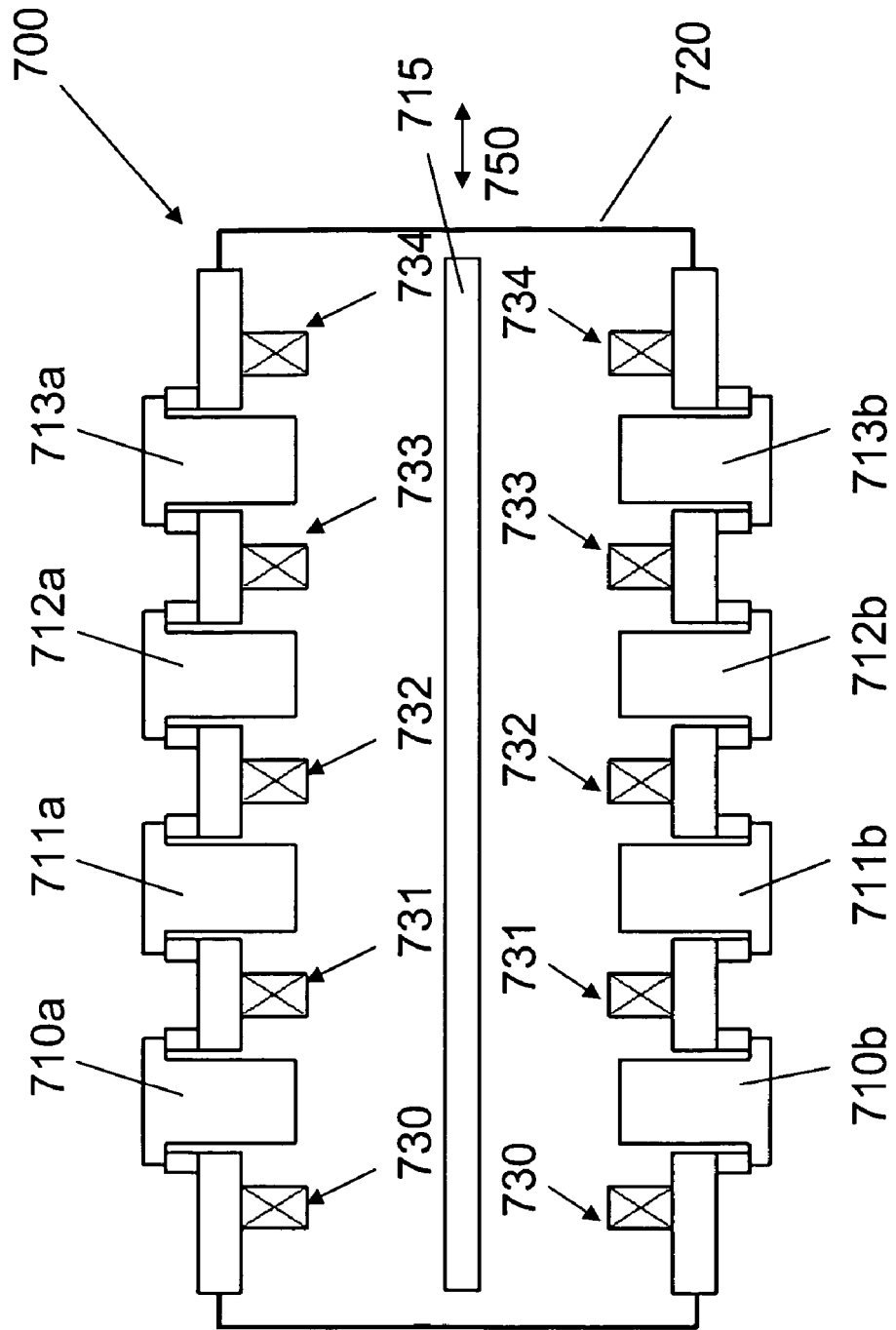
FIG. 7 shows a deposition system capable of providing a plurality of targets over or under a substrate.
Figure 8:
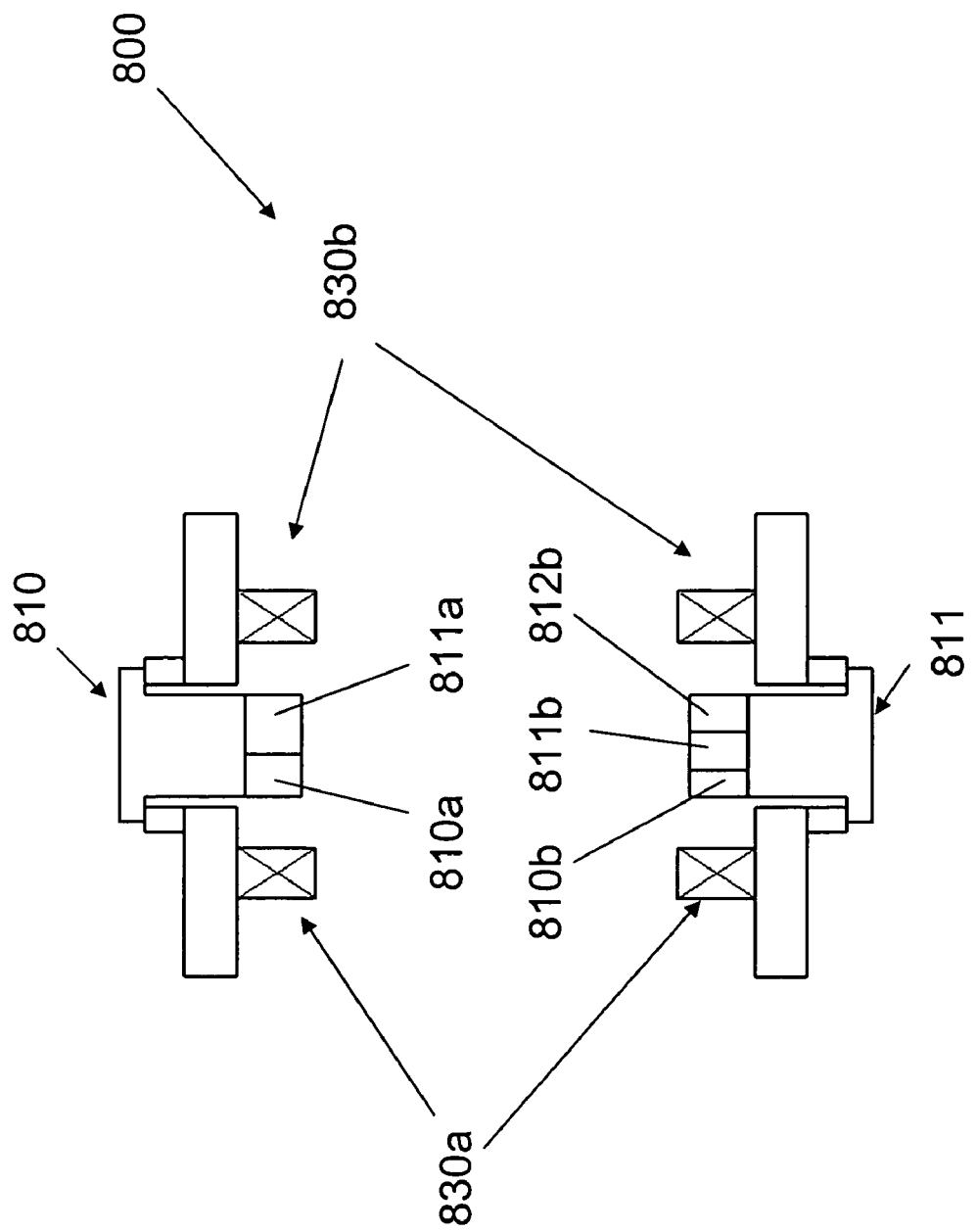
FIG. 8 shows magnetron sources and targets comprising multiple materials for a magnetron.

In another embodiment, the magnets 530a-d and 531a-d in deposition system 500 can be replaced by a pair of electric conductor coils 630a and 630b (or electromagnets) in deposition system 600, shown in FIG. 6. The electric conductor coils 630a and 630b are disposed along the two sides of the close looped targets. The electric conductor coils 630a and 630b can be applied with electric currents to produce "North" and "South" magnetic polarities and substantially uniform magnetic flux 660 in the close loop and near the sputtering surfaces 612a and 612b of the targets 610a-610d. A single electric conductor coil 630a or 630b can also produce a substantially magnetic flux parallel to the target surface and achieve similar results as two or more electric coil.

In another embodiment, a deposition system 700 can include a plurality of targets 710a, 711a, 712a and 713a that are positioned above a substrate and a plurality of targets 710b, 711b, 712b and 713b below the substrate (not shown for clarity reasons) in a vacuum chamber 720. A plurality of electric conductor coils or permanent magnets 730-734 can be alternatively positioned between the targets 710a/713a through 713a/713b to produce a uniform magnetic field in the vacuum chamber 720 and near the sputtering surfaces. Shields can be added between the adjacent targets 710a-713b to minimize the cross contamination on the substrate 715.

The substrate 715 can be transported in the horizontal direction. In one embodiment, the targets 710a-713b can comprise substantially the same target material. The substrate 715 is transported only by a short distance that is approximately the separation between the adjacent targets to produce uniform deposition over the substrate 715. The shortened travel distance by the substrate 715 reduces the foot print of the deposition system 700. In another embodiment, different target materials can be included in targets 710a-713b to enable availability of depositions of different coating compositions in one vacuum pump down of the vacuum chamber 720.

In another embodiment, targets 810 and 811 can each be positioned between electric conductor coils 830a and 830b. The target 810 includes two different portions 810a and 811a that can be made of different materials. The target 811 includes three different portions 810b, 811b and 812b that can be made of different materials. The different materials in a target can allow the deposition of materials of different compositions over the upper surface or the lower surface of a substrate.

It is understood that the disclosed system and methods are not limited to the specific description in the specification. For example, the disclosed system is suitable for material depositions on large or small substrates. In addition, the substrate can be heated and/or applied with an electric bias voltage. The deposition system can also include a vacuum load locks and a cleaning chamber for cleaning the substrate. The substrate transport mechanism can also take various forms without deviating from the spirit of the specification.

What is claimed is:

1. A magnetron source for producing a magnetic field near a surface of a target in a deposition system, comprising:
   a first magnet that forms a first rectangular continuous close loop;
   a second magnet that forms a second rectangular continuous close loop, wherein the first rectangular continuous close loop is substantially parallel to the second rectangular continuous close loop, wherein the second rectangular continuous close loop is separated by a gap from the first rectangular continuous close loop along a first direction that is substantially perpendicular to the first rectangular close loop;
   one or more target holders configured to hold a first target and a second target in the gap between the first magnet and the second magnet, wherein the first target and the second target comprise sputtering surfaces from which target materials are to be sputtered and deposited on two opposing surfaces of a planar substrate, wherein the one or more target holders are so configured that the sputtering surfaces are substantially parallel to the first direction, and wherein the first magnet and the second magnet are configured to produce a magnetic field near the sputtering surfaces of the first target and the second target; and
   a transport mechanism configured to move the planar substrate through the first rectangular continuous close loop and the second rectangular continuous close loop to allow different areas of the planar substrate to receive materials sputtered off the target, wherein the transport mechanism is configured to position the opposing surfaces of the planar substrate to be respectively facing to the sputtering surfaces.

2. The magnetron source of claim 1, wherein the first magnet and the second magnet have opposite magnetic polarities.

3. The magnetron source of claim 1, wherein at least one of the first magnet and the second magnet includes an electric conductor coil or an electromagnet.

4. The magnetron source of claim 1, wherein the first magnet and the second magnet are configured to produce magnetic flux lines substantially parallel to the sputtering surfaces of the first target and the second target.

5. The magnetron source of claim 1, wherein the first target or the second target comprise two or more portions each comprising a same or different sputtering material, wherein the two or more portions in the target are juxtaposed along the first direction.

6. The magnetron source of claim 1, wherein the first rectangular continuous close loop and the second rectangular continuous close loop have substantially the same dimensions.

7. The magnetron source of claim 1, wherein the first rectangular continuous close loop has a substantially rectangular shape, and wherein the target includes segments respectively positioned between the first magnet and the second magnet along each side of the rectangle.

8. The magnetron source of claim 1, wherein the one or more target holders are configured to hold targets that form a substantially close-loop in the gap between the first magnet and the second magnet.

9. A magnetron source for producing a magnetic field near a surface of a target in a deposition system, comprising:
   a first magnet that forms a first rectangular continuous close loop;
   a second magnet that forms a second rectangular continuous close loop, wherein the second rectangular continuous close loop is separated by a gap from the first rectangular continuous close loop along a first direction that is substantially perpendicular to the first rectangular continuous close loop, and wherein the first magnet and the second magnet have opposite magnetic polarities;
   one or more target holders configured to hold a first target and a second target in the gap between the first magnet and the second magnet, wherein each of the first target and the second target comprises a sputtering surface from which target material is to be sputtered and deposited on two opposing surfaces of a planar substrate, wherein the one or more target holders are so configured that the sputtering surfaces are substantially parallel to the first direction, wherein the first magnet and the second magnet are configured to produce a magnetic field near a surface of the one or more targets, wherein the one or more target holders are configured to hold the one or more targets to form a third close loop between the first rectangular continuous close loop and the second rectangular continuous close loop; and
   a transport mechanism configured to move the planar substrate through the first rectangular continuous close loop and the second rectangular continuous close loop to allow different areas of the planar substrate to receive materials sputtered off the target, wherein the transport mechanism is configured to position the opposing surfaces of the planar substrate to be respectively facing to the sputtering surfaces.

10. The magnetron source of claim 9, wherein the first rectangular continuous close loop and the second rectangular continuous close loop are formed substantially in rectangular shapes.

11. The magnetron source of claim 9, wherein the first rectangular continuous close loop is substantially parallel to the second rectangular continuous close loop.

12. The magnetron source of claim 9, wherein the one or more target holders are configured to hold a plurality of target segments along the third close loop.

13. The magnetron source of claim 12, wherein the plurality of target segments are separately biased by an electric voltage.

14. The magnetron source of claim 12, wherein the plurality of target segments are biased by a common electric voltage.

15. The magnetron source of claim 9, wherein the one or more targets comprise two or more portions each comprising a different sputtering material, wherein the two or more portions in the target are juxtaposed along the first direction.

16. A deposition system, comprising:
   a magnetron source, comprising:
      a first magnet that forms a first rectangular continuous close loop; and
      a second magnet that forms a second rectangular continuous close loop, wherein the second rectangular continuous close loop is separated by a gap from the first magnet along a first direction that is substantially perpendicular to the first rectangular continuous close loop;
   one or more target holders configured to hold a first target and a second target in the gap between the first magnet and the second magnet, wherein the first target and the second target comprise sputtering surfaces from which target materials are to be sputtered and deposited on two opposing surfaces of a planar substrate, wherein the one or more target holders are so configured that the sputtering surfaces are substantially parallel to the first direction, and wherein the first magnet and the second magnet are configured to produce a magnetic field near the sputtering surfaces of the first target and the second target; and
   a transport mechanism configured to move the planar substrate through the first rectangular continuous close loop and the second rectangular continuous close loop to allow different areas of the planar substrate to receive materials sputtered off the target, wherein the transport mechanism is configured to position the opposing surfaces of the planar substrate to be respectively facing to the sputtering surfaces.

17. The deposition system of claim 16, wherein the first rectangular continuous close loop and the second rectangular continuous close loop have substantially the same shape and are substantially parallel to each other, wherein the target is configured to form a third close loop between the first rectangular continuous close loop and the second rectangular continuous close loop.

18. The deposition system of claim 16, further comprising:
   a power supply configured to provide an electric potential bias between the target and the planar substrate.

19. The deposition system of claim 16, wherein the one or more targets comprise a same or different material that can be sputtered and deposited to the planar substrate.

20. The deposition system of claim 16, wherein the first magnet and the second magnet are positioned at substantially the same distance from the planar substrate.

21. A deposition system, comprising:
   a plurality of magnets that form a plurality of substantially parallel rectangular continuous close loops, wherein the plurality of rectangular continuous close loops are sequentially positioned along a first direction that is substantially perpendicular to one of the plurality of rectangular continuous close loops, wherein the plurality of magnets have alternate magnetic polarities;
   one or more target holders configured to hold one or more targets between adjacent magnets in the plurality of magnets, wherein each of the one or more targets comprises a sputtering surface; and
   a transport mechanism configured to move a planar substrate through the plurality of rectangular continuous close loops to allow two opposing surfaces of the planar substrate to receive materials sputtered of the sputtering surfaces of the targets, wherein the transport mechanism is configured to position the opposing surfaces of the planar substrate to be respectively facing to the sputtering surfaces.

22. The deposition system of claim 21, wherein the plurality of magnets comprise at least three magnets, wherein two or more targets are held between adjacent magnets in the plurality of magnets, wherein the two or more targets comprise different sputtering materials.

23. The deposition system of claim 22, wherein the two surfaces of the planar substrate are opposing to each other.

\* \* \* \* \*